US006888069B1

(12) United States Patent
Chen et al.

(10) Patent No.: US 6,888,069 B1
(45) Date of Patent: May 3, 2005

(54) EQUIPMENT TRAY FOR SIMPLIFIED INSERTION AND REMOVAL OF RACK-MOUNTED EQUIPMENT

(75) Inventors: Edward Chen, Manotick (CA); Michael Bishop, Nepean (CA); David Donald, Ottawa (CA), Pell; David Pell, Carp (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/853,842

(22) Filed: May 26, 2004

(51) Int. Cl.$^7$ ............................... H02G 3/04; A47F 5/00
(52) U.S. Cl. ..................... 174/99 R; 174/50; 174/68.3; 211/26; 361/601; 361/679; 361/826; 361/829
(58) Field of Search ............................... 174/50, 54, 63, 174/68.1, 68.3, 96–98, 99 R, 135; 211/26; 361/600, 601, 608, 609, 673, 678, 679, 690, 724, 728, 807, 826, 829, 831; 379/328; 385/135

(56) References Cited

U.S. PATENT DOCUMENTS

| | | | | |
|---|---|---|---|---|
| 6,097,604 A | * | 8/2000 | Hunter et al. ................ 361/727 |
| 6,123,203 A | * | 9/2000 | Gibbons ........................ 211/26 |
| 6,220,456 B1 | * | 4/2001 | Jensen et al. .................. 211/26 |
| 6,269,959 B1 | * | 8/2001 | Haworth ........................ 211/26 |
| 6,378,966 B1 | * | 4/2002 | Baker et al. ................. 312/333 |
| 6,483,699 B1 | * | 11/2002 | Salmonson et al. .......... 361/687 |
| 6,522,551 B2 | * | 2/2003 | Hsu et al. ..................... 361/752 |
| 6,541,705 B1 | * | 4/2003 | McGrath ................... 174/99 R |
| 6,600,656 B1 | * | 7/2003 | Mori et al. ................... 361/724 |
| 6,644,481 B2 | * | 11/2003 | Dean et al. .................... 211/26 |
| 6,682,282 B2 | * | 1/2004 | Allen ........................... 211/26 |
| 6,693,797 B2 | * | 2/2004 | Faneuf et al. ................ 361/689 |
| 6,719,149 B2 | * | 4/2004 | Tomino ........................ 211/26 |

* cited by examiner

*Primary Examiner*—Dean A. Reichard
*Assistant Examiner*—Adolfo Nino
(74) *Attorney, Agent, or Firm*—Guerin & Rodriguez, LLP (57) ABSTRACT

An equipment tray for simplified insertion and removal of electronic equipment to a rack is described. The electronics equipment can be horizontally or vertically mounted. The tray has a first region in which electronics equipment is releasably secured and a second region that provides cable management and exhaust airflow control.

18 Claims, 7 Drawing Sheets

EQUIPMENT TRAY FOR SIMPLIFIED INSERTION AND REMOVAL OF RACK-MOUNTED EQUIPMENT

FIELD OF THE INVENTION

The invention relates to mounting electronics equipment in a rack. More specifically, the invention relates to an equipment tray that horizontally or vertically mounts electronics equipment.

BACKGROUND OF THE INVENTION

In some communications systems, electronics modules are vertically mounted to an equipment rack. In other systems, the modules are mounted horizontally. Typically, the modules are directly mounted to the rack by inserting a fastener through an attachment assembly integral to the module. To replace a module, a technician removes the fasteners and lifts the module out of the rack. The attachment assembly is removed with the module.

A technician supports the weight of the module while removing the fasteners from both attachment assemblies. Often, the size or weight of the electronics modules prevents the technician from removing the module without the assistance of a second technician. Similarly, attaching a new electronics module can require multiple technicians.

What is needed a mounting system that allows for insertion and removal of the electronics modules of the system in less time by a single person. The present invention satisfies this need and provides additional advantages.

SUMMARY OF THE INVENTION

The following presents a simplified summary of the invention in order to provide a basic understanding of some aspects of the invention. This summary is not an extensive overview of the invention. It is not intended to identify key or critical elements of the invention or delineate the scope of the invention. Its sole purpose is to present some concepts of the invention in a simplified form as a prelude to the more detailed description presented below.

In one aspect, the invention relates to an equipment tray for mounting electronics equipment within a rack. The tray includes a bottom panel, a first edge panel, a second edge panel, a lip, and a locking mechanism. The bottom panel has a first edge, a second edge, and a third edge. The first edge panel is adjacent to the first edge and extends normal to the bottom panel. The first edge panel has a tab extending from an outside face of the first edge panel. The tab has an opening for receiving a fastener to attach the equipment tray to the rack. The second edge panel is adjacent to the second edge and extends normal to the bottom panel. The second edge panel has a tab extending from an outside face of the second edge panel. The lip is adjacent to the third edge and extends normal to the bottom panel. The locking mechanism secures the electronics equipment to the equipment tray and releases the electronics equipment from the equipment tray.

In one embodiment, the tray includes an assembly attached to at least one of the second edge panel and the bottom panel. The assembly defines a first volume for routing cables and a second volume for receiving the electronics equipment. The first volume can also include an exhaust port for exhausting an airflow and a baffle to control the direction of the exhaust.

In another aspect, the invention relates to a system for mounting electronics equipment. The system includes a means for stacking a plurality of electronics modules and a means for supporting one of the electronics modules. The means for supporting attaches to the means for stacking. The system also includes a means for locking the one of the electronics modules to the means for supporting and releasing the one of the electronics modules from the means for supporting. The means for locking allows the replacement of the one of the electronics modules without removing the means for supporting from the means for stacking.

In another aspect, the invention relates to an electronics equipment rack. The rack includes a first stanchion and a second stanchion separated from and in parallel arrangement with each other. Each stanchion has a plurality of openings for receiving a fastener. The equipment tray attaches to the rack by inserting the fasteners through the openings of the tabs and the openings in the rack.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 1:
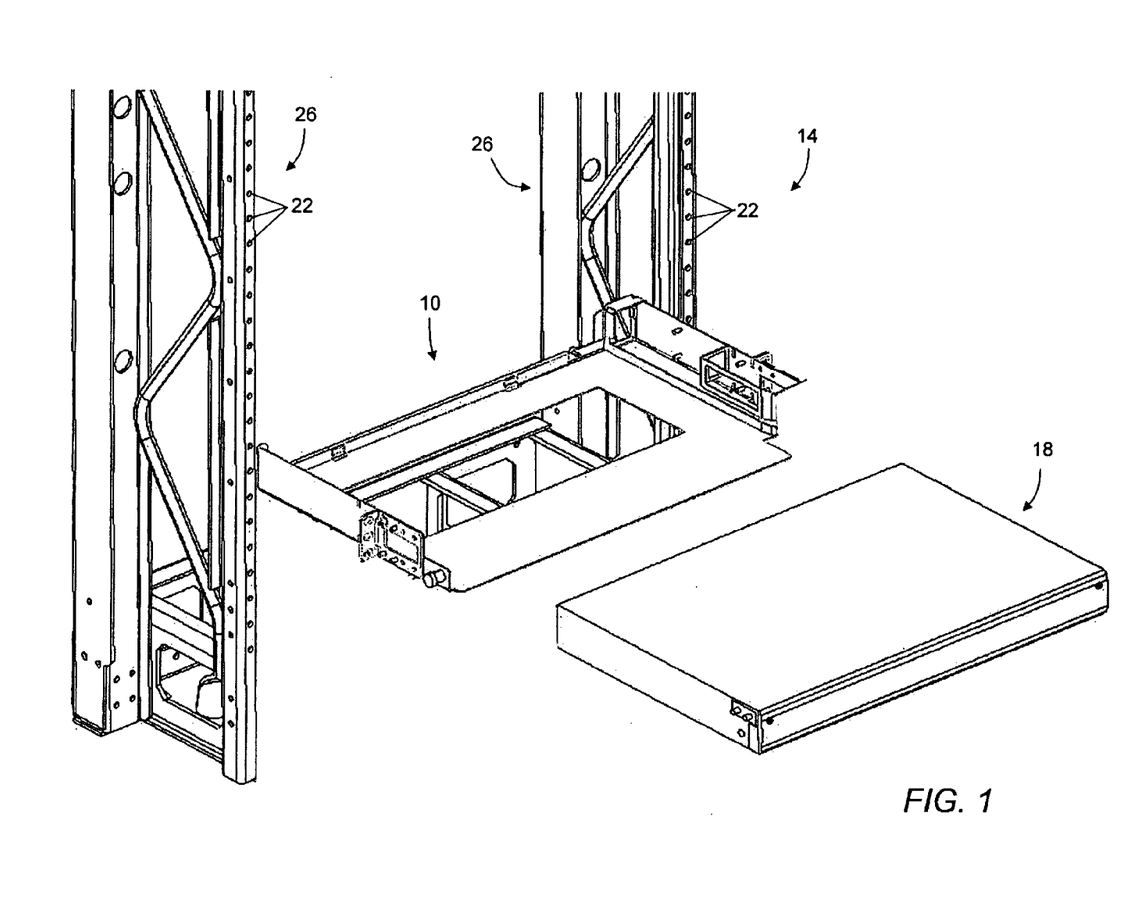
FIG. 1 is an exploded view of a rack, an electronics module, and an embodiment of an equipment tray constructed according to the principles of the invention.

FIG. 1 depicts an embodiment of an equipment tray 10 constructed according to the principles of the invention and exploded from a rack 14 and electronics module 18. The rack 14 includes a pair of stanchions 26 that are in parallel alignment with each other. The stanchions 26 include bores 22 that receive fasteners to secure the tray 10 to the rack 14. The bores 22 allow for adjustment of the position of the tray 10 in the rack 14 and the stacking of one or more of the modules 18 in the rack 14. The tray 10 is configured to receive, secure, and support the electronics module 18 when a technician inserts the module 18 into rack 14. The electronics module 18 is removable from the tray 10; however, the tray 10 remains attached to the rack 14 when the technician removes the module 18 from the tray 10. As such, a single technician can remove the module 18 and insert a replacement module without assistance.

Figure 2:
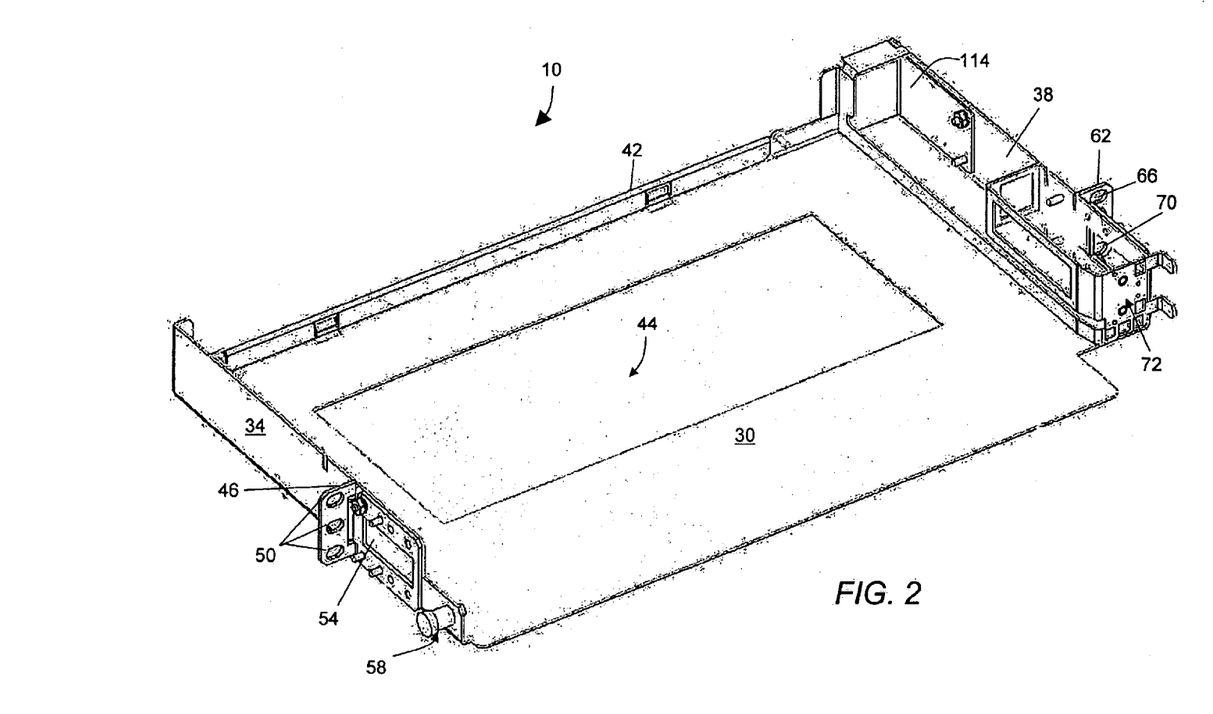
FIG. 2 is an isometric view of the equipment tray of FIG. 1.

FIG. 2 shows an isometric view of the equipment tray 10 of FIG. 1. The tray 10 includes a bottom panel 30, a left edge panel 34, a right edge panel 38, and a lip 42. The bottom panel 30 includes an opening 44 that reduces the overall weight of the tray 10. The left edge panel 34 extends substantially normal from a left edge of the bottom panel 30.

Similarly, the right edge panel 38 extends substantially normal from a right edge of the bottom panel 30. The lip 42 extends substantially normal from a back edge of the bottom panel 30 and connects to both the left edge panel 34 and the right edge panel 38.

A left tab 46 extends normal to the left edge panel 34 and includes a plurality of openings 50 that receive fasteners for attaching the tray 10 to the rack 14. The left tab 46 makes contact with a respective stanchion 26 of the rack 14 when the tray 10 is attached to the rack 14. The plurality of openings 50 in the tab 46 provide for fine height adjustment of the tray 10 relative to the bores 22 of the stanchions 26, which provide grosser height adjustment. An airflow enters the tray 10 through an air inlet 54 located in the left edge panel 34 in front of left tab 46. The left tab 46 can be integral with the left edge panel 34. Alternatively, the left tab 46 can be constructed as a bracket and attached to the left edge panel 34 using fasteners. A locking mechanism 58 for securing the electronic module 18 to the tray 10 extends through the left edge panel 34 proximate to a front edge of the bottom panel 34.

A right tab 62 having similar features to the left tab 46 extends substantially normal to the right edge panel 38. An exhaust port 70 located in the right edge panel 38 exhausts the airflow that cools the electronics module 18.

Communications cables and optical fibers (not shown) interconnect a plurality of stack ed electronics modules 18. The communications cables can be Ethernet cables or other types of cables. Proper routing of the cables and fibers facilitates removal of the electronics module 18. The fibers and cables enter the tray 10 through a region 72 in front of the right tab 62 and connect to the module 18. The fibers are routed inside the right edge panel 38 and are thus maintained "in-board" of the stanchions 26. These features allow for routing and managing a larger volume of fibers relative to other systems having equipment mounted between the stanchions. In the other systems, fiber and cable manage ment and rout ing occurs outside the stanchions. Routing and managing the cables and fibers in-board of the stanchions improves access to the fibers and cables, segregation of the fibers and cables, protection from over-bending, and tracing the location of specific fibers.

Typically when a communication system is installed, the electronic modules 18 mounted to the rack 14 communicate with each other through a backplane. As such, the backplane is designed to accommodate the maximum number of electronic modules 18 that can be accommodated by the system. Using Ethernet cables to connect the modules 18 eliminates the need for the backplane. Consequently, equipment and start-up costs are lower. Modules can be added and removed to accommodate system demands. Thus costs associated with expanding the system are deferred. As such, the invention provides a "pay-as-you-grow" modular communication system that can be expanded and contracted as desired.

Figure 3:
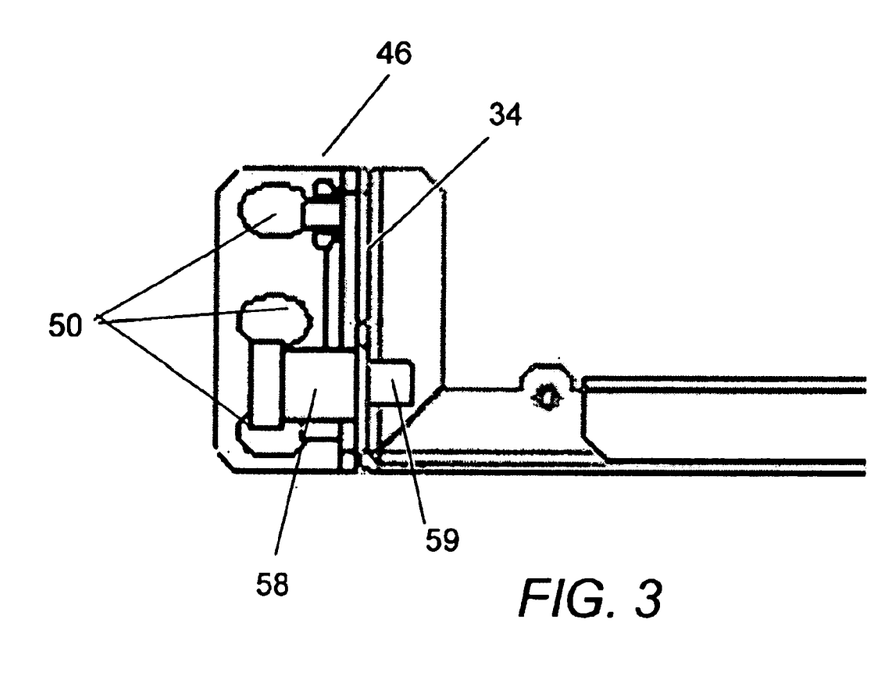
FIG. 3 is a front view of the locking mechanism of FIG. 2.

FIG. 3 shows details of the locking mechanism 58 of FIG. 2. The locking mechanism 58 secures the electronics module 18 in the tray 10 and provides for a quick release of the electronics module 18 from the tray 10. In the illustrated embodiment, the locking mechanism 58 includes a spring-loaded pin. A portion 59 of the pin extends into the interior of the tray 10 through the left edge panel 34. A notch in the electronics module 18 receives the portion 59 of the pin when the module 18 is fully inserted into the tray 10. In the event the electronics module 18 requires replacement, a technician pulls the pin away from the left edge panel 34, which removes the pin from the notch and allows the module 18 to be removed from the tray 10. In another embodiment, the locking mechanism is a spring catch, a rotating catch, a thumb screw or a quarter-turn fastener; however, any mechanism that provides releasable attachment of the electronics module 18 to the tray 10 can be used.

Figure 4:
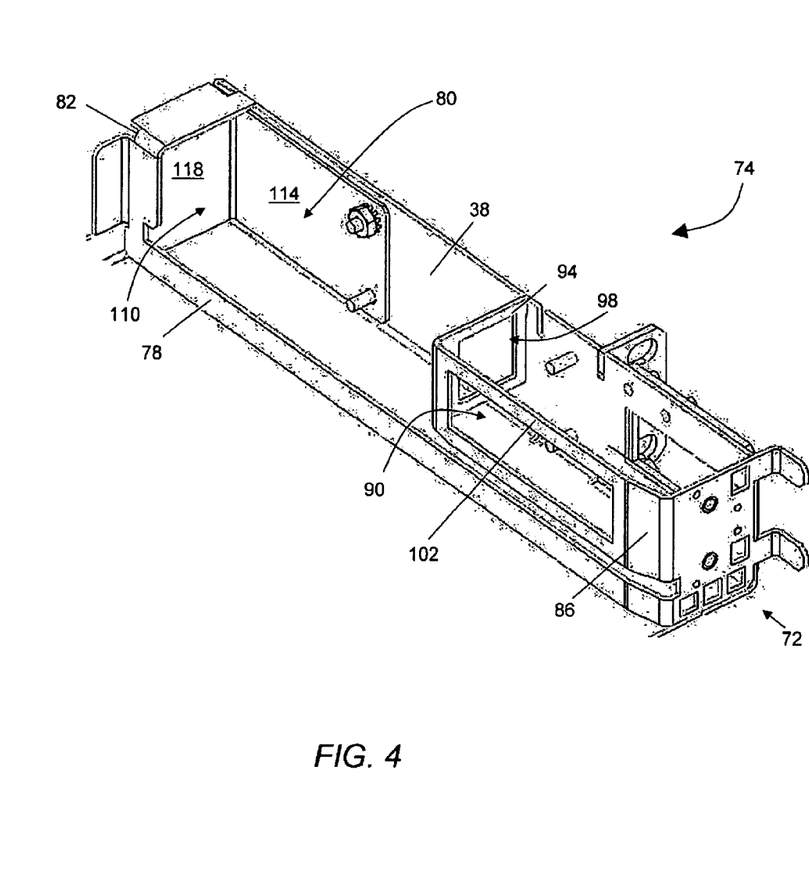
FIG. 4 is an isometric view of a fiber routing and exhaust management assembly of the equipment tray of FIG. 2.

FIG. 4 shows details of an embodiment of an assembly 74 that attaches to or is integral with the bottom panel 30 and right edge panel 38 of the equipment tray 10. The assembly 74 defines an open volume 80 between the right edge panel 38 and bottom panel 30. The open volume 80 is adjacent to a volume that receives the electronics module 18. The open volume 80 allows the cooling airflow to be exhausted. The assembly 74 includes a lip 78, a rear bracket 82, and a front bracket 86. The lip 78 extends normal from the bottom panel 30, is in parallel alignment with the right edge panel 38, and divides the bottom panel 30 into a left region, which receives the electronics module 18 and a right region, which is under the open volume 80. The rear bracket 82 attaches to the lip 78 and the right edge panel 38 proximate to the rear edge of the tray 10. Similarly, the front bracket 86 attaches to the lip 82 and the right edge panel 38 proximate to the front edge of the tray 10.

In one embodiment, a divider bracket 90 attaches to the right edge panel 38 and the front bracket 86, and divides the open volume 80 into two separate volumes. A first face 94 of the divider bracket 90 extends normal to the right edge panel 38. An opening 98 in the first face 94 functions as an exhaust port. A second face 102 of the divider panel 90 extends parallel to the lip 78 from the first face 94 to the front bracket 86.

A baffle 110, which is also referred to as an exhaust controller, attached to an inside face of the right edge panel 38 controls the direction of an airflow within the open volume 80. The baffle 110 is "L-shaped", although other shapes can be used and sized to fit within the open volume 80. An elongate section 114 and a blocking section 118 form the baffle 110. The elongate section 114 is secured the inside face of the right edge panel 38 by a screw or similar fastener. The blocking section 118 extends normal to the elongate section 114 and substantially covers an exhaust port of the tray 10 to inhibit an airflow from exiting the tray 10 through the exhaust port. As such, the baffle 10 controls the direction in which the airflow is exhausted from the tray 10.

Figure 5:
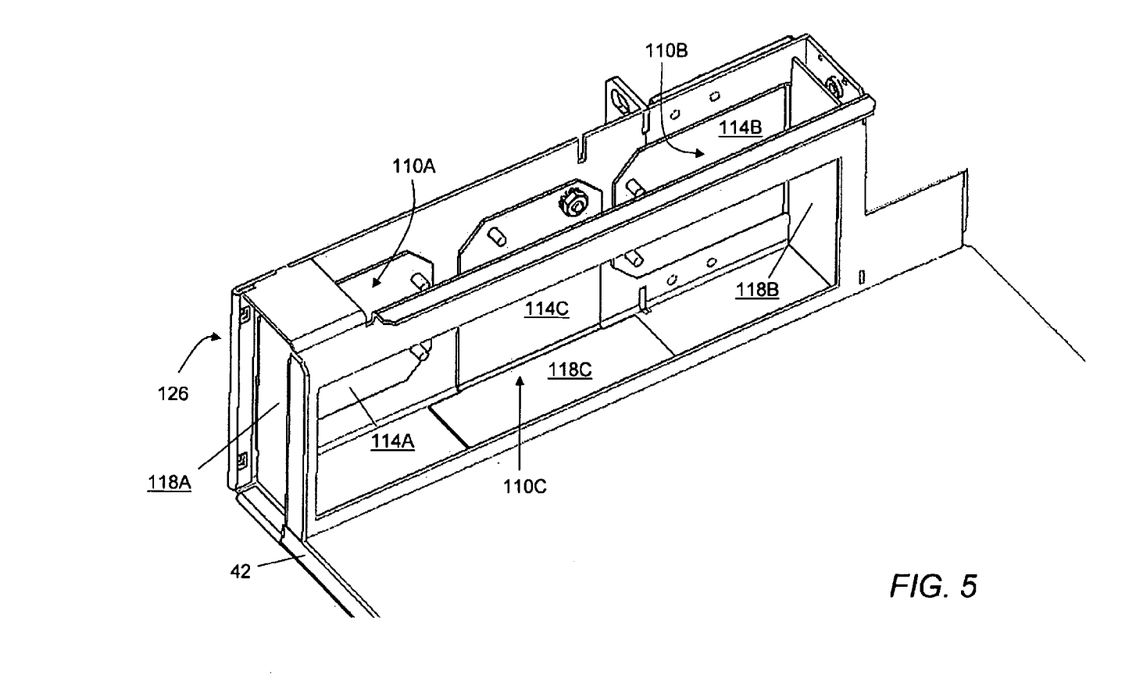
FIG. 5 is an isometric view of an exhaust baffle in three possible configurations.

FIG. 5 shows three different configurations for the exhaust controller 110A, 110B and 110C. Depending on the specific application and the location of the rack 18, it may be desirable to exhaust the airflow out the front of the tray 10, out the rear of the tray 10, or out the front and rear of the tray 10 simultaneously. In one configuration, the baffle 110A is attached to the inside face of the right edge panel 38 such that the blocking section 118A substantially covers a rear exhaust port 126 at the rear of the open volume 80. This configuration prohibits the airflow from exiting the tray 10 through the rear exhaust port 126. Instead, the airflow exits through the front of the tray 10.

In a second configuration, the blocking section 118B substantially covers a front exhaust port of the open volume 80. Alternatively, the front exhaust port can be located in the right edge panel 38. As such, the elongate section 114B also covers the front exhaust port. An example of a front exhaust port includes the first opening 98 of the divider bracket 90 and the exhaust port 70. This configuration prevents the airflow from exiting the tray 10 through the front of the open volume 80. Instead, the airflow exits through the rear of the tray 10.

In a third configuration, neither the blocking section 118C nor the elongate section 114C covers the rear exhaust port 126 or the front exhaust port 112. As such the airflow is exhausted through the front and the rear of the tray 10.

Figure 6:
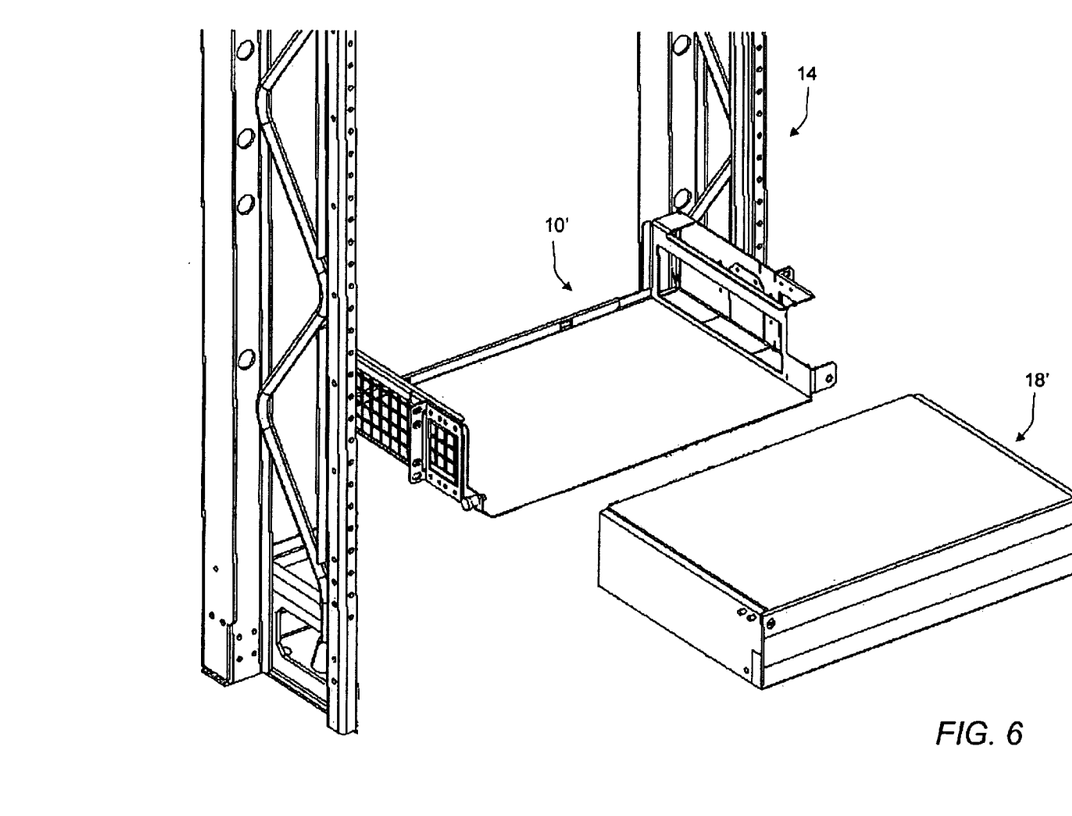
FIG. 6 is an exploded view of a rack, an electronics module, and an embodiment of an equipment tray constructed according to the principles of the invention.

FIG. 6 depicts an alternative embodiment of an equipment tray 10' constructed according to the principles of the invention and shown with an electronics module 18' as exploded from the rack 14. The tray 10' receives, supports, and secures the electronics module 18' within the rack 14. The illustrative electronics module 18' is larger than the module 18 shown in FIG. 1 but is similarly removable from its tray 10'.

Figure 7:
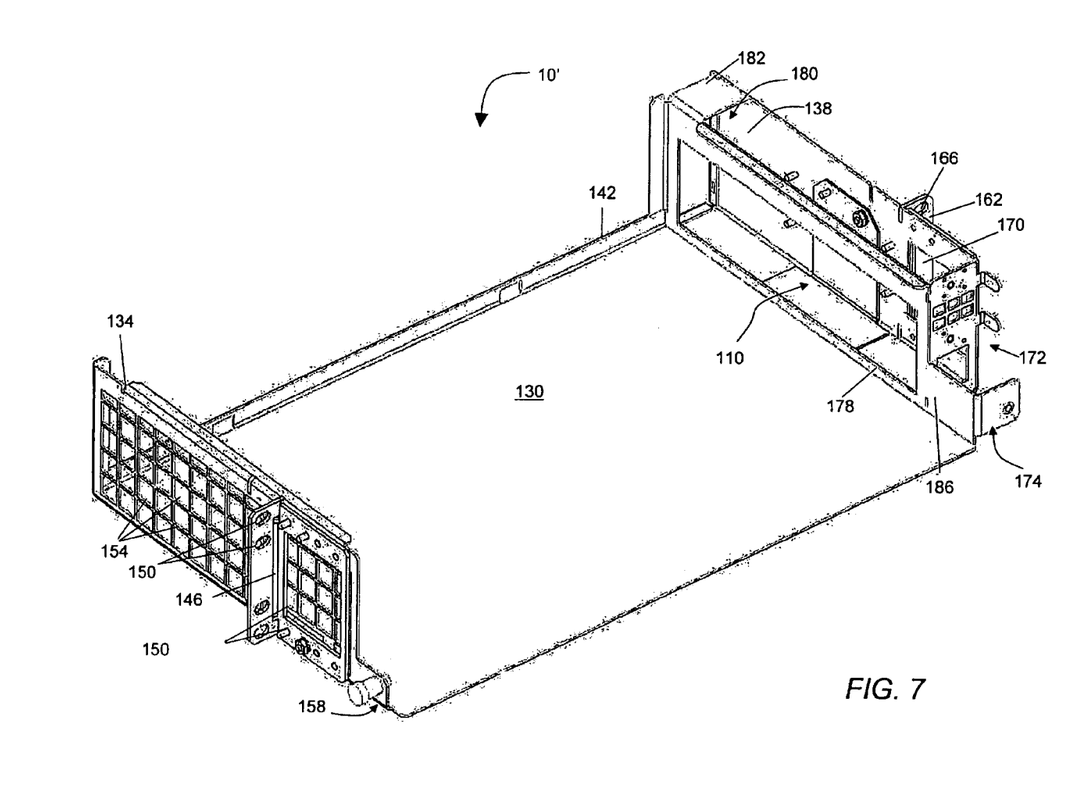
FIG. 7 is an isometric view of the equipment tray of FIG. 6.

FIG. 7 shows an isometric view of the equipment tray 10'. The tray 10' includes a bottom panel 130, a left edge panel 134, a right edge panel 138, and a lip 142, which are configured similarly to respective features of the tray 10 of FIG. 1. A left tab 146 extends substantially normal to the left edge panel 134 and includes a plurality of openings 150 configured to receive a fastener to attach the tray 10' the rack 14'. The left edge panel 134 includes a plurality of openings that form a grate 154. An airflow for cooling the module 18' enters the tray 10' through the grate 154. A locking mechanism 158 extends through the left edge panel 134 proximate to a front edge of the bottom panel 134. The locking mechanism 158 functions similarly to the locking mechanism 58 of FIGS. 1 and 2.

A right tab 162 having features similar to the left tab 146 extends substantially normal to the right edge panel 138 and is located near an exhaust port 170. The fibers and cables enter the tray 10' through a region 172 in front of the left tab 162.

The tray 10' also includes an assembly 174 that attaches to or is integral with the bottom panel 130 and right edge panel 138 of the equipment tray 10'. The assembly 174 defines an open volume 180 between the right edge panel 138 and bottom panel 130. The open volume 180 is adjacent to a volume that receives the electronics module 18'. The open volume 180 allows an airflow to be exhausted from the module 18. The assembly 174 includes a lip 178, a rear bracket 182, and a front bracket 186, which are configured similar to the assembly 74 of FIG. 4. The baffle 110 attaches to an inside face of the right edge panel 138 and controls the direction of the airflow within the open volume 180.

While the invention has been shown and described with reference to specific preferred embodiments, it should be understood by those skilled in the art that various changes in form and detail may be made therein without departing from the spirit and scope of the invention as defined by the following claims. For example, the tray 10 is constructed of sheet metal; however, other materials such a plastic can be used in certain applications.

What is claimed is:

1. An equipment tray for mounting electronics equipment within a rack comprising:
   a bottom panel having a first edge, a second edge, and a third edge;
   a first edge panel adjacent to the first edge and extending normal to the bottom panel, the first edge panel having a tab extending from an outside face of the first edge panel, the tab having a opening for receiving a fastener to attach the equipment tray to the rack;
   a second edge panel adjacent to the second edge and extending normal to the bottom panel, the second edge panel having a tab extending from an outside face of the second edge panel, the tab having an opening for receiving a fastener to attach the equipment tray to the rack;
   a lip adjacent to the third edge and extending normal to the bottom panel;
   a second lip between the first edge panel and the second edge panel, the second lip extending normal to the bottom panel and being parallel to the first edge panel, the second lip, the first edge panel and the second edge panel defining a first region for receiving the electronics equipment and a second region; and
   a locking mechanism for securing the electronics equipment to the equipment tray and releasing the electronics equipment from the equipment tray.

2. The equipment tray of claim 1 further comprising an exhaust port in the second region and an exhaust controller movably attached to the second edge panel to route an airflow to the exhaust port.

3. The equipment tray of claim 2 wherein the exhaust controller comprises a baffle.

4. The equipment tray of claim 1 wherein the first edge panel comprises a grate to direct an airflow across the electronics equipment.

5. The equipment tray of claim 1 wherein locking mechanism comprises a spring-loaded pin.

6. An electronics equipment rack comprising:
   a first stanchion and a second stanchion separated from and in parallel arrangement with each other, each stanchion having a plurality of openings; and
   an equipment tray comprising:
   a bottom panel having a first edge, a second edge, and a third edge;
   a first edge panel adjacent to the first edge and extending normal to the bottom panel, the first edge panel having a tab extending from an outside face of the first edge panel, the tab having a opening for receiving a first fastener to attach the equipment tray to the first stanchion;
   a second edge panel adjacent to the second edge and extending normal to the bottom panel, the second edge panel having a tab extending from an outside face of the second edge panel, the tab having an opening for receiving a fastener to attach the tab to the second stanchion;
   a lip adjacent to the third edge and extending normal to the bottom panel;
   a second lip between the first edge panel and the second edge panel, the second lip extending normal to the bottom panel and being parallel to the first edge panel, the second lip, the first edge panel and the second edge panel defining a first region for receiving the electronics equipment and a second region; and
   a locking mechanism for securing the electronics equipment to the equipment tray and releasing the electronics equipment from the equipment tray.

7. A system for mounting electronics equipment comprising:
   means for supporting one of the electronics modules, the means for supporting being fastened to the means for stacking; and
   means for locking and releasing one of the electronics modules without removing the means for supporting from the means for stacking, the means for locking and releasing being integral with the means for supporting.

8. An equipment tray for mounting electronics equipment within a rack comprising:
   a bottom panel having a first edge, a second edge, and a third edge;
   a first edge panel adjacent to the first edge and extending normal to the bottom panel, the first edge panel having a tab extending from an outside face of the first edge panel, the tab having a opening for receiving a fastener to attach the equipment tray to the rack;

a second edge panel adjacent to the second edge and extending normal to the bottom panel, the second edge panel having a tab extending from an outside face of the second edge panel, the tab having an opening for receiving a fastener to attach the equipment tray to the rack;

an assembly attached to at least one of the second edge panel and the bottom panel to define a first volume for routing cables therein and a second volume for receiving the electronics equipment; and a locking mechanism integral with at least one of the first edge panel and second edge panel for securing the electronics equipment in the second volume and releasing the electronics equipment from the second volume.

9. The equipment tray of claim 8 further comprising an exhaust port within the first volume and a baffle movably attached to the second edge panel for controlling the direction of an airflow within the first volume.

10. The equipment tray of claim 9 wherein the first edge panel comprises a grate for directing the airflow across the electronic equipment.

11. A system for mounting electronics equipment comprising:

means for stacking a plurality of electronics modules;

means for supporting one of the electronics modules, the means for supporting being fastened to the means for stacking, the means for supporting defining a first volume for receiving the one of the electronics modules and a second volume for fiber routing; and means for locking the one of the electronics modules to the means for supporting and releasing the one of the electronics modules from the means for supporting, the means for locking being integral with the means for supporting and allowing for the replacement of the one of the electronics modules without removing the means for supporting from the means for stacking.

12. The system of claim 11 wherein the second volume comprises means for accessing the second volume to route the fiber.

13. The system of claim 12 further comprising means for exhausting an airflow from the second volume of the means for supporting.

14. An equipment tray for mounting electronics equipment within a rack comprising:

a bottom panel having a first edge, a second edge, and a third edge;

a first edge panel adjacent to the first edge and extending normal to the bottom panel, the first edge panel having a tab extending from an outside face of the first edge panel, the tab having a opening for receiving a fastener to attach the equipment tray to the rack;

a second edge panel adjacent to the second edge and extending normal to the bottom panel, the second edge panel having a tab extending from an outside face of the second edge panel, the tab having an opening for receiving a fastener to attach the equipment tray to the rack;

an assembly attached to the second edge panel and the bottom panel defining a first volume for exhausting an airflow and a second volume for receiving the electronics equipment; and a locking mechanism being integral with at least one of the first edge panel and second edge panel for securing the electronics equipment in the region of the equipment tray and releasing electronics equipment from the region of the equipment tray.

15. The equipment tray of claim 14 further comprising a baffle movably attached to the second edge panel for controlling the direction of the airflow within the first volume.

16. The equipment tray of claim 15 wherein the first edge panel comprises a grate for directing the flow across the electronics equipment.

17. A system for mounting electronics equipment comprising:

means for stacking a plurality of electronics modules;

means for supporting one of the electronics modules, the means for supporting being fastened to the means for stacking, the means for supporting comprising a first volume for receiving the one of the electronics modules and a second volume for exhausting an airflow; and means for locking and releasing one of the electronics modules without removing the means for supporting from the means for stacking, the means for locking and releasing being integral with the means for supporting.

18. The system of claim 17 wherein the means for exhausting the airflow comprises means for baffling.

* * * * *

UNITED STATES PATENT AND TRADEMARK OFFICE
CERTIFICATE OF CORRECTION

PATENT NO. : 6,888,069 B1
DATED : May 26, 2004
INVENTOR(S) : Chen et al.

It is certified that error appears in the above-identified patent and that said Letters Patent is hereby corrected as shown below:

<u>Title page,</u>
Item [75], Inventors, delete "Ottawa (CA), Pell;" and substitute -- Ottawa (CA); --.

<u>Column 6,</u>
Lines 53-54, after "comprising:" and before "means" insert -- means for stacking a plurality of electronics modules; --.

Signed and Sealed this

Thirtieth Day of August, 2005

JON W. DUDAS
*Director of the United States Patent and Trademark Office*